US012749459B2

(12) United States Patent
Song

(10) Patent No.: US 12,749,459 B2
(45) Date of Patent: Sep. 29, 2026

(54) DISPLAY DEVICE HAVING MUX PART AND METHOD OF DRIVING THE SAME

(71) Applicant: LG Display Co., Ltd., Seoul (KR)

(72) Inventor: Won-Seok Song, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 19/372,121

(22) Filed: Oct. 28, 2025

(65) Prior Publication Data

US 2026/0057848 A1 Feb. 26, 2026

Related U.S. Application Data

(62) Division of application No. 18/421,591, filed on Jan. 24, 2024, now Pat. No. 12,482,430.

(30) Foreign Application Priority Data

Jan. 30, 2023 (KR) ........................ 10-2023-0011820

(51) Int. Cl.

| | |
|---|---|
| ***G09G 3/3275*** | (2016.01) |
| ***G09G 3/20*** | (2006.01) |
| ***G09G 3/3225*** | (2016.01) |
| ***G09G 3/3266*** | (2016.01) |
| ***H10K 59/131*** | (2023.01) |

(52) U.S. Cl.

CPC ......... *G09G 3/3275* (2013.01); *G09G 3/2096* (2013.01); *G09G 3/3225* (2013.01);

(Continued)

(58) Field of Classification Search

CPC .. G09G 3/3275; G09G 3/2096; G09G 3/3225; G09G 2300/0819;

(Continued)

(56) References Cited

U.S. PATENT DOCUMENTS

| | | | |
|---|---|---|---|
| 10,902,777 | B1 | 1/2021 | Huang et al. |
| 11,094,266 | B2 | 8/2021 | Heo et al. |

(Continued)

FOREIGN PATENT DOCUMENTS

| | | | |
|---|---|---|---|
| CN | 108122543 A | 6/2018 | |
| JP | 5240538 B2 | 7/2013 | |

(Continued)

OTHER PUBLICATIONS

European Patent Office, Extended European Search Report, European Patent Application No. 24154584.7, Jun. 20, 2024, 14 pages.

(Continued)

*Primary Examiner* — Ricardo Osorio
(74) *Attorney, Agent, or Firm* — Fenwick & West LLP

(57) ABSTRACT

A display device includes a timing controlling circuit configured to generate image data, a data control signal and a gate control signal; a data driving circuit configured to generate a data signal using the image data and the data control signal and generate a mux signal using an offset signal, a high level voltage signal and the data signal; a gate driving circuit configured to generate gate signals, emission signals using the gate control signal; and a display panel including pixels that are configured to display an image using the data signal, the mux signal, the gate signals, and the emission signals, wherein the mux signal is one of the high level voltage signal and voltage that is a sum of the data signal and the offset signal, and the mux signal is supplied to a power line that is connected to a pixel included in the display panel.

8 Claims, 9 Drawing Sheets

(52) U.S. Cl.
CPC ......... *G09G 3/3266* (2013.01); *H10K 59/131* (2023.02); *G09G 2300/0819* (2013.01); *G09G 2300/0842* (2013.01); *G09G 2310/0297* (2013.01); *G09G 2320/0252* (2013.01)

(58) Field of Classification Search
CPC ... G09G 2300/0842; G09G 2310/0297; G09G 2320/0252; G09G 3/3266; G09G 2330/021; G09G 2300/0861; G09G 2310/0251; G09G 2310/0262; G09G 2310/08; G09G 2320/045; G09G 3/3233; G09G 2310/0243; G09G 2310/061; G09G 2320/0626; H10K 59/131; H10D 30/6755
See application file for complete search history.

(56) References Cited

U.S. PATENT DOCUMENTS

| | | | |
|---|---|---|---|
| 12,236,876 | B2 | 2/2025 | Morita |
| 12,347,226 | B2 | 7/2025 | Lee et al. |
| 2008/0111812 | A1 | 5/2008 | Shirasaki et al. |
| 2020/0160795 | A1 | 5/2020 | Heo et al. |
| 2021/0012711 | A1 | 1/2021 | Huang et al. |
| 2021/0201736 | A1 | 7/2021 | You et al. |
| 2022/0351662 | A1 | 11/2022 | You et al. |

FOREIGN PATENT DOCUMENTS

| | | | |
|---|---|---|---|
| KR | 10-2008-0106338 | A | 12/2008 |
| KR | 10-2014-0064158 | A | 5/2014 |
| KR | 10-2017-0122432 | A | 11/2017 |
| KR | 10-2020-0055580 | A | 5/2020 |
| KR | 10-2020-0058847 | A | 5/2020 |

OTHER PUBLICATIONS

Korean Intellectual Property Office, Office Action, Korean Patent Application No. 10-2023-0011820, Jul. 10, 2025, 13 pages.

DISPLAY DEVICE HAVING MUX PART AND METHOD OF DRIVING THE SAME

CROSS-REFERENCE TO RELATED APPLICATION

The present application is a divisional patent application of U.S. patent application Ser. No. 18/421,591, filed on Jan. 24, 2024, which claims the priority benefit of Republic of Korea Patent Application No. 10-2023-0011820, filed in Republic of Korea on Jan. 30, 2023, all of which are hereby incorporated by reference in their entirety.

BACKGROUND

Technical Field

The present disclosure relates to a display device, and more particularly, to a display device where a hysteresis of a driving transistor is reduced or minimized and a response speed is improved by supplying a mux signal of a voltage close to a data signal to a gate electrode of the driving transistor during an initialization period and a method of driving the display device.

Discussion of the Related Art

Recently, with the advent of an information-oriented society, the interest in information displays for processing and displaying a massive amount of information and the demand for portable information media have increased. As such, a display field has rapidly advanced. Thus, various light and thin flat panel display devices have been developed and highlighted.

Among the various flat panel display devices, an organic light emitting diode (OLED) display device is an emissive type device that does not include a backlight unit used in a non-emissive type device such as a liquid crystal display (LCD) device. As a result, the OLED display device has advantages in a viewing angle, a contrast ratio and a power consumption to be applied to various fields.

In the OLED display device, a high level voltage signal is supplied to a gate electrode of a driving transistor during an initialization period and a data signal is supplied to the gate electrode of the driving transistor during a sampling period. Hysteresis occurs in the driving transistor due to a voltage difference of the high level voltage signal and the data signal. As a result, since the gate electrode of the driving transistor does not reach a target voltage during the sampling period, a response speed of the driving transistor is reduced and a light emitting diode does not emit a light of a predetermined luminance.

SUMMARY

Accordingly, the present disclosure is directed to a display device that substantially obviates one or more of the problems due to limitations and disadvantages of the related art.

An object of the present disclosure is to provide a display device where hysteresis of a driving transistor is reduced or minimized and a response speed of the driving transistor is improved by supplying a mux signal of a voltage close to a data signal to a gate electrode of the driving transistor during an initialization period and a method of driving the display device.

Another object of the present disclosure is to provide a display device where a gate electrode of a driving transistor reaches a target voltage within a relatively short time during a sampling period and a light emitting diode emits a light of a target luminance and a method of driving a display device.

Additional features and advantages of the disclosure will be set forth in the description which follows, and in part will be apparent from the description, or can be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display device comprises: a timing controlling circuit configured to generate image data, a data control signal, and a gate control signal; a data driving circuit configured to generate a data signal using the image data and the data control signal and generate a mux signal using an offset signal, a high level voltage signal, and the data signal; a gate driving circuit configured to generate a gate1 signal, a gate2 signal, an emission1 signal and an emission2 signal using the gate control signal; and a display panel including a plurality of subpixels that are configured to display an image using the data signal, the mux signal, the gate1 signal, the gate2 signal, the emission1 signal, and the emission2 signal, wherein the mux signal is one of the high level voltage signal and a voltage that is a sum of the data signal and the offset signal that is less than the high level voltage signal, and the mux signal is supplied to a power line that is connected to at least one of the plurality of subpixels included in the display panel.

In one embodiment, a method of driving a display device comprises: generating, by a timing controlling circuit, image data, a data control signal and a gate control signal; generating, by a data driving circuit, a data signal using the image data and the data control signal, and generating a mux signal using an offset signal, a high level voltage signal, and the data signal; generating, by a gate driving circuit, a gate1 signal, a gate2 signal, an emission1 signal and an emission2 signal using the gate control signal; and displaying, by a plurality of subpixels included in a display panel, an image using the data signal, the mux signal, the gate1 signal, the gate2 signal, the emission1 signal and the emission2 signal, wherein the mux signal is one of the high level voltage signal and a voltage that is a sum of the data signal and the offset signal that is less than the high level voltage signal and the mux signal is supplied to a power line that is connected to at least one of the plurality of subpixels included in the display panel.

In one embodiment, a display device comprises: a display panel including a data line, a power line, and a pixel circuit, the pixel circuit comprising: a driving transistor that is electrically connected to the power line, the driving transistor configured to control a driving current; a switching transistor connected to the data line and the driving transistor, the switching transistor configured to supply a data voltage supplied by the data line to the driving transistor; and a light emitting element that is electrically connected to the driving transistor, the light emitting element configured to emit light according to the driving current; and a circuit configured to output a mux signal having a first voltage to the driving transistor via the power line at a second time and output the mux signal having a second voltage that is less than the first voltage at a first time that is before the second time, the second voltage of the mux signal at the second time based on the data voltage.

It is to be understood that both the foregoing general description and the following detailed description are explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Figure 1:
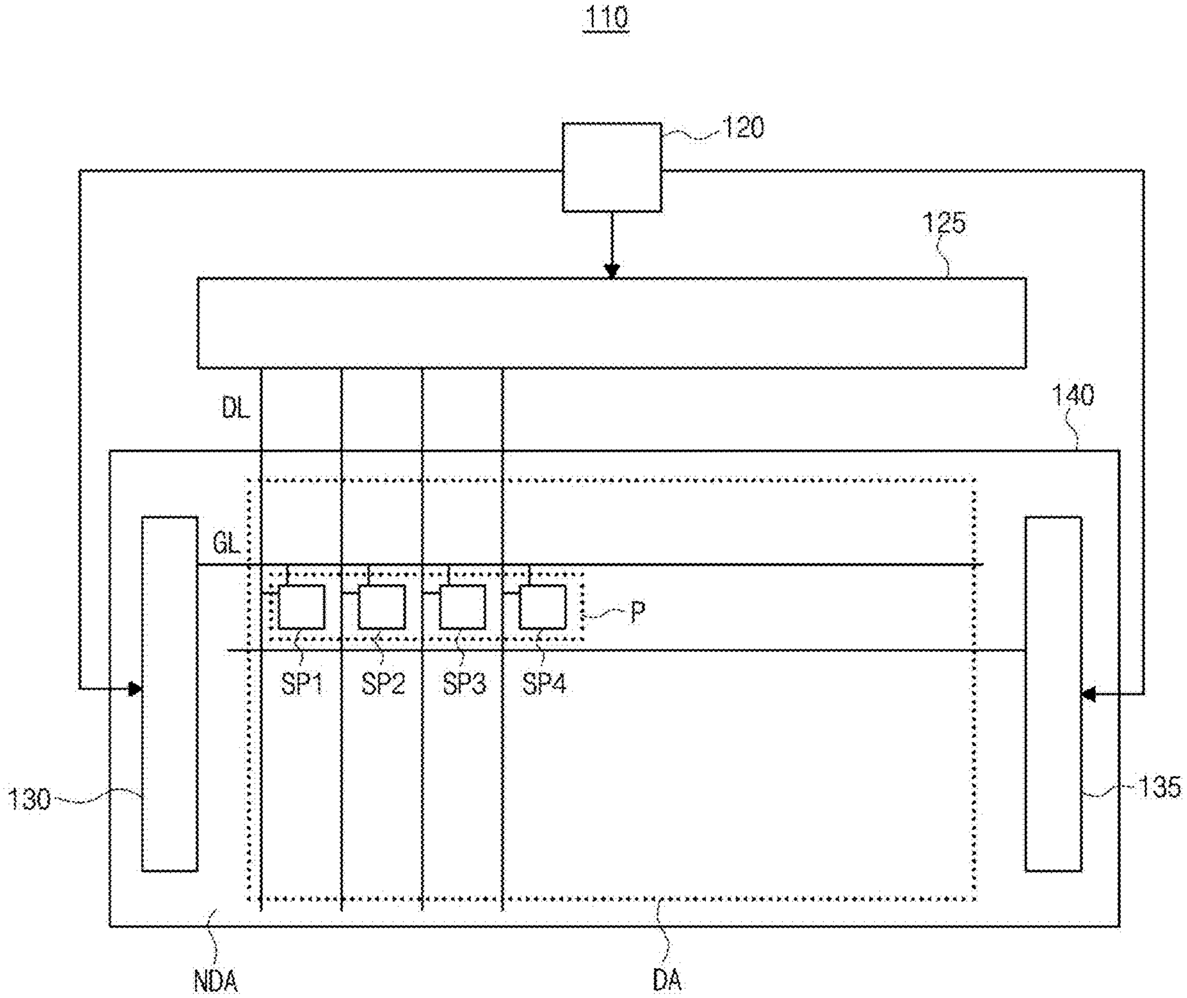
FIG. 1 is a view showing a display device according to a first embodiment of the present disclosure.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure. Further, the present disclosure is only defined by scopes of claims.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Like reference numerals refer to like elements throughout the specification, unless otherwise specified.

In the following description, where the detailed description of the relevant known function or configuration may unnecessarily obscure a feature or aspect of the present disclosure, a detailed description of such known function or configuration may be omitted or a brief description may be provided.

Where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or a tolerance range even where no explicit description of such an error or tolerance range is provided.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

Although the terms "first," "second," A, B, (a), (b), and the like may be used herein to refer to various elements, these elements should not be interpreted to be limited by these terms as they are not used to define a particular order or precedence. These terms are only used to distinguish one element from another. For example, a first element could be termed a second element, and, similarly, a second element could be termed a first element, without departing from the scope of the present disclosure.

The term "at least one" should be understood to include all combinations of one or more of related elements. For example, the term of "at least one of first, second and third elements" may include all combinations of two or more of the first, second and third elements as well as the first, second or third element.

The term "display device" may include a display device in a narrow sense such as liquid crystal module (LCM), an organic light emitting diode (OLED) module and a quantum dot (QD) module including a display panel and a driving unit for driving the display panel. In addition, the term "display device" may include a complete product (or a final product) including the LCM, the OLED module and the QD module such as a notebook computer, a television, a computer monitor, an equipment display device including an automotive display apparatus or a shape other than a vehicle, and a set electronic apparatus or a set device (or a set apparatus) such as a mobile electronic apparatus of a smart phone or an electronic pad.

Accordingly, a display device of the present disclosure may include an applied product or a set device of a final user's device including the LCM, the OLED module and the QD module as well as a display device in a narrow sense such as the LCM, the OLED module and the QD module.

According to circumstances, the LCM, the OLED module and the QD module having a display panel and a driving unit may be expressed as "a display device", and an electronic apparatus of a complete product including the LCM, the OLED module and the QD module may be expressed as "a set device." For example, a display device in a narrow sense may include a display panel of a liquid crystal, an organic light emitting diode and a quantum dot and a source printed circuit board (PCB) of a control unit for driving the display panel, and a set device may further include a set PCB of a set control unit electrically connected to the source PCB for controlling the entire set device.

The display panel of the present disclosure may include all kinds of display panels such as a liquid crystal display panel, an organic light emitting diode display panel, a quantum dot display panel and an electroluminescent display panel. The display panel of the present disclosure is not limited to a specific display panel of a bezel bending having a flexible substrate for an organic light emitting diode display panel and a lower back plate supporter. A shape or a size of the display panel for the display device of the present disclosure is not limited thereto.

For example, when the display panel is an organic light emitting diode display panel, the display panel may include a plurality of gate lines, a plurality of data lines and a subpixel in a crossing region of the plurality of gate lines and the plurality of data lines. The display panel may include an array having a thin film transistor of an element for selectively applying a voltage to each subpixel, an emitting element layer on the array and an encapsulating substrate or an encapsulation part covering the emitting element layer. The encapsulation part may protect the thin film transistor and the emitting element layer from an external impact and may prevent or at least reduce penetration of a moisture or an oxygen into the emitting element layer. In addition, a layer on the array may include an inorganic light emitting layer, for example, a nano-sized material layer or a quantum dot.

The thin film transistor of the present disclosure may include one of an oxide thin film transistor, an amorphous silicon thin film transistor, a low temperature polycrystalline silicon thin film transistor.

Features of various embodiments of the present disclosure may be partially or entirely coupled to or combined with each other. They may be linked and operated technically in various ways as those skilled in the art can sufficiently understand. The embodiments may be carried out independently of or in association with each other in various combinations.

Hereinafter, a display device according to various example embodiments of the present disclosure where an influence on an oxide semiconductor layer of a thin film transistor of a driving element part is reduced by shielding a light emitted and transmitted from a subpixel and/or a light inputted from an exterior will be described in detail with reference to the accompanying drawings.

FIG. 1 is a view showing a display device according to a first embodiment of the present disclosure. The display device may be an organic light emitting diode (OLED) display device.

In FIG. 1, a display device 110 according to a first embodiment of the present disclosure includes a timing controlling unit 120, a data driving unit 125, first and second gate driving units 130 and 135 and a display panel 140.

The timing controlling unit 120 (e.g., a timing controlling circuit) generates an image data, a data control signal and a gate control signal using an image signal and a plurality of timing signals including a data enable signal, a horizontal synchronization signal, a vertical synchronization signal and a clock signal transmitted from an external system such as a graphic card or a television system. The image data and the data control signal are transmitted to the data driving unit 125, and the gate control signal is transmitted to the first and second gate driving units 130 and 135.

The data driving unit 125 (e.g., a data driving circuit) generates a data signal (a data voltage) Vdata (of FIG. 5) using the data control signal and the image data transmitted from the timing controlling unit 120 and transmits the data signal to a data line DL of the display panel 140.

The first and second gate driving units 130 and 135 (e.g., first and second gate driving circuits) generate a gate signal (a gate voltage) Sc1 and Sc2 (of FIG. 5) and an emission signal (an emission voltage) Em (of FIG. 5) using the gate control signal transmitted from the timing controlling unit 120 and applies the gate signal Sc1 and Sc2 and the emission signal Em to gate lines GL of the display panel 140.

The first and second gate driving units 130 and 135 may have a gate in panel (GIP) type to be formed in a non-display area NDA of a substrate of the display panel 140 having the gate line GL, the data line DL and a pixel P.

Although the first and second gate driving units 130 and 135 are disposed in both side portions of the display panel 140 in the embodiment of FIG. 1, one gate driving unit may be disposed in one side portion of the display panel 140 in another embodiment.

The display panel 140 includes a display area DA at a central portion thereof and a non-display area NDA surrounding the display area DA. The display panel 140 displays an image using the gate signal Sc1 and Sc2, the emission signal Em and the data signal Vdata. For displaying an image, the display panel 140 includes a plurality of pixels P, a plurality of gate lines GL and a plurality of data lines DL in the display area DA.

Each of the plurality of pixels P includes first to fourth subpixels SP1 to SP4, and the gate line GL and the data line DL cross each other to define the first to fourth subpixels SP1 to SP4. Each of the first to fourth subpixels SP1 to SP4 is connected to the gate line GL and the data line DL. For example, the first to fourth subpixels SP1 to SP4 may correspond to red, green, blue and white colors, respectively.

When the display device 110 is an OLED display device, each of the first to fourth subpixels SP1 to SP4 may include a plurality of transistors such as a switching transistor, a driving transistor and a sensing transistor, a storage capacitor and a light emitting diode.

A structure of the display panel 140 and the subpixel SP of the display device 110 will be illustrated with reference to a drawing.

Figure 2:
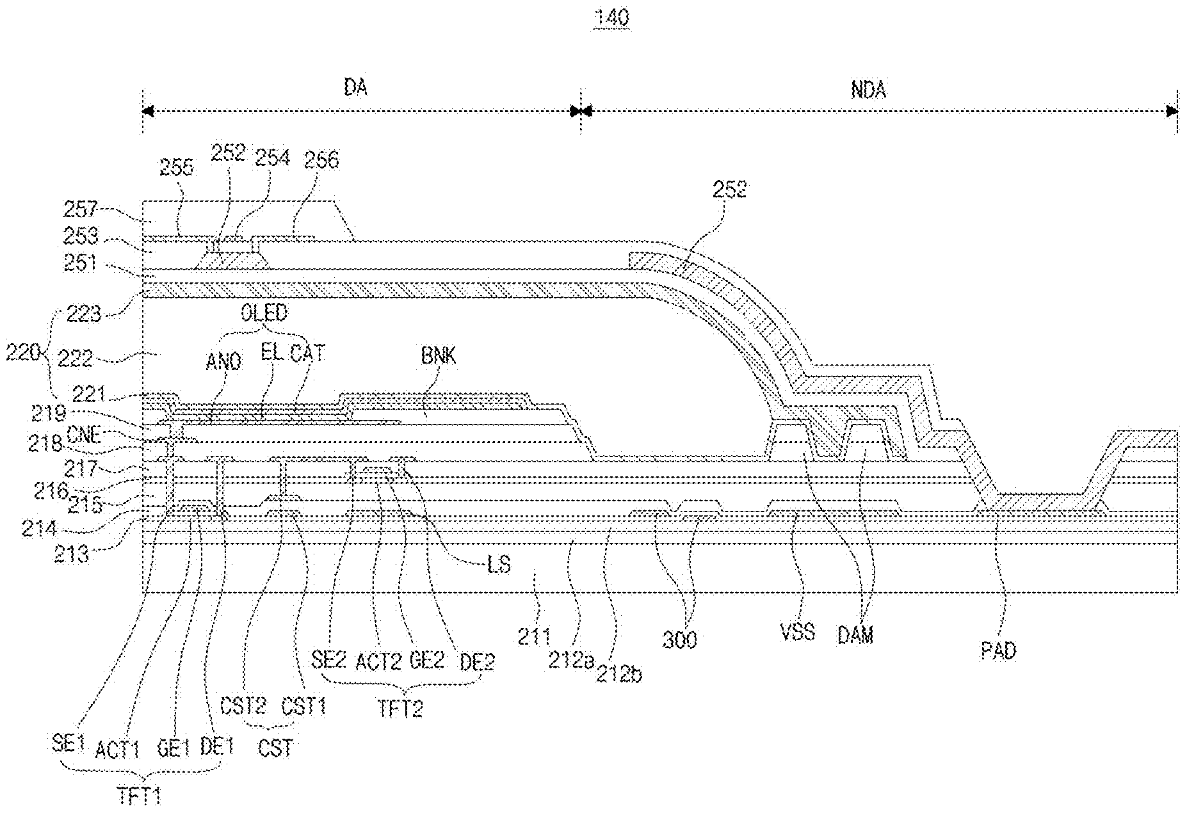
FIG. 2 is a cross-sectional view showing a display panel of a display device according to a first embodiment of the present disclosure.

FIG. 2 is a cross-sectional view showing a display panel of a display device according to a first embodiment of the present disclosure.

In FIG. 2, the display panel 140 of the display device according to a first embodiment of the present disclosure includes first and second thin film transistors TFT1 and TFT2 and a storage capacitor CST. The first and second thin film transistors TFT1 and TFT2 may include a polycrystalline semiconductor material or an oxide semiconductor material. For example, the first thin film transistor TFT1 may include a polycrystalline semiconductor material, and the second thin film transistor TFT2 may include an oxide semiconductor material.

The first thin film transistor TFT1 is connected to a light emitting diode OLED, and the second thin film transistor is connected to the storage capacitor CST.

One pixel P includes the light emitting diode OLED and a pixel circuit supplying a driving current to the light emitting diode OLED. The pixel circuit is disposed on a substrate 211, and the light emitting diode OLED is disposed on the pixel circuit. An encapsulating layer 220 is disposed on the light emitting diode OLED to protect the light emitting diode OLED.

The pixel circuit may include a driving thin film transistor, a switching thin film transistor and a storage capacitor. The light emitting diode OLED may include an anode, a cathode and an emitting layer between the anode and the cathode.

The driving thin film transistor and at least one switching thin film transistor use an oxide semiconductor material as an active layer. The thin film transistor using the oxide semiconductor material as an active layer has an excellent blocking effect for a leakage current and has a lower fabrication cost as compared with a thin film transistor using a polycrystalline semiconductor material as an active layer. As a result, to reduce a power consumption and a fabrication cost, the pixel circuit may include the driving thin film transistor and the at least one switching thin film transistor using the oxide semiconductor material.

For example, all of thin film transistors of the pixel circuit may be formed of the oxide semiconductor material, or a portion of the switching thin film transistors may be formed of the oxide semiconductor material.

The thin film transistor using the oxide semiconductor material has a relatively low reliability, while the thin film transistor using the polycrystalline semiconductor material has a relatively rapid operation speed and a relatively high reliability. As a result, the pixel circuit in an embodiment may include both of a switching thin film transistor using the oxide semiconductor material and a switching thin film transistor using the polycrystalline semiconductor material.

The substrate 211 may have multiple layers of an organic layer and an inorganic layer that are alternately laminated. For example, the substrate 211 may include an organic layer of an organic insulating material such as polyimide and an inorganic layer of an inorganic insulating material such as silicon oxide (SiO2) alternately laminated.

A lower buffer layer 212*a* is disposed on the substrate 211. The lower buffer layer 212*a* may block a moisture permeable from an exterior and may have a multiple layer including silicon oxide (SiO2). An auxiliary buffer layer 212*b* for protecting elements from a moisture is disposed on the lower buffer layer 212*a*.

The first thin film transistor TFT1 is disposed on the substrate 211. The first thin film transistor TFT1 may use a polycrystalline semiconductor material as an active layer. The first thin film transistor TFT1 includes a first active layer ACT1 having a channel where an electron or a hole moves, a first gate electrode GE1, a first source electrode SE1 and a first drain electrode DE1.

The first active layer ACT1 includes a first channel region, a first source region at one side of the channel region and a first drain region at the other side of the channel region.

The first source region and the first drain region includes an intrinsic polycrystalline semiconductor material doped with an impurity of III or V group such as boron (B) or phosphorous (P). The first channel region includes an intrinsic polycrystalline semiconductor material to provide a path where an electron or a hole moves.

The first thin film transistor TFT1 includes a first gate electrode GE1 overlapping the first channel region of the first active layer ACT1. A first gate insulating layer 113 is disposed between the first gate electrode GE1 and the first active layer ACT1. The first gate insulating layer 113 may have a single layer or a multiple layer of an inorganic insulating material such as silicon oxide (SiO2) and silicon nitride (SiNx).

The first thin film transistor TFT1 has a top gate structure where the first gate electrode GE1 is disposed on the first active layer ACT1. As a result, a first capacitor electrode CST1 of the storage capacitor CST and a light shielding layer LS of the second thin film transistor TFT2 may have the same material as the first gate electrode GE1. A fabrication process may be simplified by forming the first gate electrode GE1, the first capacitor electrode CST1 and the light shielding layer LS through one mask process.

The first gate electrode GE1 may include a metallic material. For example, the first gate electrode GE1 may have a single layer or a multiple layer of one of molybdenum (Mo), aluminum (Al), chromium (Cr), gold (Au), titanium (Ti), nickel (Ni), neodymium (Nd), copper (Cu) and an alloy thereof.

A first interlayer insulating layer 214 is disposed on the first gate electrode GE1. The first interlayer insulating layer 214 may include an inorganic insulating material such as silicon oxide (SiO2) and silicon nitride (SiNx).

The display panel 140 may further include an upper buffer layer 215, a second gate insulating layer 216 and a second interlayer insulating layer 217 sequentially disposed on the first interlayer insulating layer 214. The first thin film transistor TFT1 may include a first source electrode SE1 and a first drain electrode DE1 on the second interlayer insulating layer 217, and the first source electrode SE1 and the first drain electrode DE1 may be connected to the first source region and the first drain region, respectively.

The first source electrode SE1 and the first drain electrode DE1 may have a single layer or a multiple layer of one of molybdenum (Mo), aluminum (Al), chromium (Cr), gold (Au), titanium (Ti), nickel (Ni), neodymium (Nd), copper (Cu) and an alloy thereof.

The upper buffer layer 215 separates a second active layer ACT2 of an oxide semiconductor material of the second thin film transistor TFT2 from the first active layer ACT1 of a polycrystalline semiconductor material and provides a base for the second active layer ACT2.

The second gate insulating layer 216 covers the second active layer ACT2 of the second thin film transistor TFT2. Since the second gate insulating layer 216 is disposed on the second active layer ACT2 of an oxide semiconductor material, the second gate insulating layer 216 includes an inorganic insulating material. For example, the second gate insulating layer 216 may include silicon oxide (SiO2) and silicon nitride (SiNx).

A second gate electrode GE2 includes a metallic material. For example, the second gate electrode GE2 may have a single layer or a multiple layer of one of molybdenum (Mo), aluminum (Al), chromium (Cr), gold (Au), titanium (Ti), nickel (Ni), neodymium (Nd), copper (Cu) and an alloy thereof.

The second thin film transistor TFT2 is disposed on the upper buffer layer 215 and includes the second active layer ACT2 of an oxide semiconductor material, the second gate electrode GE2 on the second gate insulating layer 216, a second source electrode SE2 and a second drain electrode DE2 on the second interlayer insulating layer 217.

The second active layer ACT2 includes a second channel region, a second source region and a second drain region. The second channel region includes an intrinsic oxide semiconductor material which is not doped with an impurity, and the second source region and the second drain region are doped with an impurity to be conductorized.

The second thin film transistor TFT2 is disposed under the upper buffer layer 215 and further includes a light shielding layer LS overlapping the second active layer ACT2. The light shielding layer LS blocks light incident to the second active layer ACT2 to obtain a reliability of the second thin film transistor TFT2. The light shielding layer LS may include the same material as the first gate electrode GE1 and may be disposed on a top surface of the first gate insulating layer 213. The light shielding layer LS may be electrically connected to the second gate electrode GE2 to constitute a double gate structure.

A fabrication process may be simplified by forming the second source electrode SE2 and the second drain electrode DE2 on the second interlayer insulating layer 217 simultaneously with the first source electrode SE1 and the first drain electrode DE1 through one mask process.

A second capacitor electrode CST2 is disposed on the first interlayer insulating layer 214. The second capacitor electrode CST2 overlaps the first capacitor electrode CST1 to constitute a storage capacitor CST. For example, the second capacitor electrode CST2 may have a single layer or a multiple layer of one of molybdenum (Mo), aluminum (Al), chromium (Cr), gold (Au), titanium (Ti), nickel (Ni), neodymium (Nd), copper (Cu) and an alloy thereof.

The storage capacitor CST stores the data signal supplied through the data line DL and supplies the data signal to the light emitting diode OLED. The storage capacitor CST includes two electrodes corresponding to each other and a dielectric layer between the two electrodes. A first interlayer insulating layer 214 is disposed between the first capacitor electrode CST1 and the second capacitor electrode CST2.

One of the first and second capacitor electrodes CST1 and CST2 of the storage capacitor CST may be electrically connected to one of the second source electrode SE2 and the second drain electrode DE2 of the second thin film transistor TFT2. In another embodiment, a connection of the storage capacitor CST may be changed according to the pixel circuit.

A first planarizing layer 218 and a second planarizing layer 219 are sequentially disposed on the pixel circuit for planarizing the pixel circuit. The first planarizing layer 218 and the second planarizing layer 219 may include an organic insulating material such as polyimide and acrylic resin.

A light emitting diode OLED is disposed on the second planarizing layer 219.

The light emitting diode OLED includes an anode ANO, a cathode CAT and an emitting layer EL between the anode ANO and the cathode CAT. When the pixel circuit uses a low level voltage signal Vss (of FIG. 5) connected to the cathode CAT commonly, the anode ANO may be disposed in each subpixel as an individual electrode. When the pixel circuit uses a high level voltage signal connected to the anode ANO commonly, the cathode CAT may be disposed in each subpixel as an individual electrode.

The light emitting diode OLED is electrically connected to a driving element through a central electrode CNE on the first planarizing layer 218. The anode ANO of the light emitting diode OLED and the first source electrode SE1 of the first thin film transistor TFT1 of the pixel circuit are connected to each other through the central electrode CNE.

The anode ANO is connected to the central electrode CNE through a contact hole in the second planarizing layer 219. The central electrode CNE is connected to the first source electrode SE1 through a contact hole in the first planarizing layer 218.

The central electrode CNE connects the first source electrode SE1 and the anode ANO. The central electrode CNE may include a conductive material such as copper (Cu), silver (Ag), molybdenum (Mo) and titanium (Ti).

The anode ANO may have multiple layers including a transparent conductive layer and an opaque conductive layer having an excellent reflectance. The transparent conductive layer may include a material having a relatively high work function such as indium tin oxide (ITO) and indium zinc oxide (IZO). The opaque conductive layer may have a single layer or a multiple layer of one of aluminum (Al), silver (Ag), copper (Cu), lead (Pb), molybdenum (Mo), titanium (Ti) and an alloy thereof. For example, the anode ANO may have a structure such that a transparent conductive layer, an opaque conductive layer and a transparent conductive layer are sequentially laminated or a structure such that a transparent conductive layer and an opaque conductive layer are sequentially laminated.

The emitting layer EL includes a hole relating layer, an organic emitting layer and an electron relating layer sequentially or reversely laminated.

A bank layer BNK may be referred to as a pixel defining layer exposing the anode ANO of each of subpixels SP1 to SP4. The bank layer BNK may include an opaque material (e.g., a black material) to prevent a light interference between the adjacent subpixels SP1 to SP4. The bank layer BNK may include a shielding material of at least one of a color pigment, an organic black and a carbon. A spacer may be disposed on the bank layer BNK.

The cathode CAT is disposed on an top surface and a side surface of the emitting layer EL to oppose the anode ANO with the emitting layer interposed therebetween. The cathode CAT may be disposed in the entire display area DA as one body. In a top emission type display device, the cathode CAT may include a transparent conductive material such as indium tin oxide (ITO) and indium zinc oxide (IZO).

An encapsulating layer 220 that prevents or at least reduces permeation of moisture on the emitting layer EL may be disposed on the cathode CAT.

The encapsulating layer 220 may block permeation of a moisture or an oxygen of an exterior into the emitting layer EL. The encapsulating layer 220 may include at least one inorganic encapsulating layer and at least one organic encapsulating layer. The encapsulating layer 220 may exemplarily include a first encapsulating layer 221, a second encapsulating layer 222 and a third encapsulating layer 223 in the display device 110.

The first encapsulating layer 221 is disposed on the cathode CAT. The third encapsulating layer 223 is disposed on the second encapsulating layer 222 and wraps a top surface, a bottom surface and a side surface of the second encapsulating layer 222 with the first encapsulating layer 221. The first encapsulating layer 221 and the third encapsulating layer 223 may minimize or prevent permeation of a moisture or an oxygen of an exterior into the emitting layer EL. The first encapsulating layer 221 and the third encapsulating layer 223 may include an inorganic insulating material applicable to a low temperature deposition such as silicon nitride (SiNx), silicon oxide (SiOx), silicon oxynitride (SiON) and silicon aluminum oxide (Al2O3). Deterioration of the emitting layer EL vulnerable to a relatively high temperature may be prevented by depositing the first encapsulating layer 221 and the third encapsulating layer 223 under a relatively low temperature.

The second encapsulating layer 222 may alleviate a stress between the layers of the display device 110 due to bending and may planarize a step difference of the layers of the display device 110. The second encapsulating layer 222 may be disposed on the first encapsulating layer 221 and may include a non-photosensitive organic insulating material such as acrylic resin, epoxy resin, phenolic resin, polyamide resin, polyimide resin, polyethylene and silicon oxycarbide (SiOC) or a photosensitive organic insulating material such as photoacryl. When the second encapsulating layer 222 is formed through an inkjet method, a dam DAM may be disposed to prevent diffusion of the liquid material for the second encapsulating layer 222 to an edge portion of the substrate 211. The dam DAM may be disposed closer to the edge portion of the substrate 211 than the second encapsulating layer 222. Due to the dam DAM, it is prevented that the second encapsulating layer 222 is diffused to a pad area of an outermost edge portion of the substrate 211 where a conductive pad is disposed.

Although the dam DAM is disposed to prevent diffusion of the second encapsulating layer 222, a moisture may permeate the emitting layer through the exposed second encapsulating layer 222 when the second encapsulating layer 222 is formed higher than the dam DAM. As a result, the dam DAM may be formed to have a number of at least ten.

The dam DAM may be disposed on the second interlayer insulating layer 217 in the non-display area NDA.

The dam DAM may be formed simultaneously with the first planarizing layer 218 and the second planarizing layer 219. For example, a lower layer of the dam DAM may be formed simultaneously with the first planarizing layer 218 and an upper layer of the dam DAM may be formed simultaneously with the second planarizing layer 219 such that the dam DAM has a double layered structure.

As a result, the dam DAM may have the same material as the first planarizing layer 218 and the second planarizing layer 219.

The dam DAM may be disposed to overlap a low level voltage line VSS. For example, the low level voltage line VSS may be disposed under the dam DAM in the non-display area NDA.

The low level voltage line VSS and the first and second gate driving units 130 and 135 having a gate-in-panel (GIP) type are disposed to surround the display area DA of the display panel 140, and the low level voltage line VSS may be disposed outside the first and second gate driving units 130 and 135. Further, the low level voltage line VSS may be connected to the cathode CAT to supply a common voltage. Although the first and second gate driving units 130 and 135 are shown to have a simple structure in FIG. 1, the first and second gate driving units 130 and 135 may include thin film transistors having the same structure as the thin film transistor of the display area DA.

For example, the low level voltage line VSS may have the same material as the first gate electrode GE1 or the same material as the second capacitor electrode CST2, the first source electrode SE1 and the first drain electrode DE1.

The low level voltage line VSS may supply a low level voltage signal Vss (of FIG. 5) to the subpixel SP1 to SP4 in the display area DA.

A touch layer may be disposed on the encapsulating layer 220. A touch buffer layer 251 of the touch layer may be disposed between a touch sensor metal and the cathode CAT of the light emitting diode OLED, and the touch sensor metal may include touch connecting lines 252 and 254 and touch electrodes 255 and 256.

The touch buffer layer 251 may block permeation of a solution (a developing solution or an etching solution) used in a fabrication process of the touch sensor metal on the touch buffer layer 251 or a moisture of an exterior into the emitting layer EL including an organic material. As a result, the touch buffer layer 251 may prevent deterioration of the emitting layer EL susceptible to a solution or a moisture.

The touch buffer layer 251 includes an organic insulating material applicable to a relatively low temperature lower than about 100° C. and having a dielectric constant of about 1 to about 3 to prevent deterioration of the emitting layer EL including an organic material vulnerable to a relatively high temperature. For example, the touch buffer layer 251 may include a material of an acrylic group, an epoxy group or a siloxane group. The touch buffer layer 251 of an organic insulating material having a planarization property may prevent deterioration of the encapsulating layer 220 due to a bending of the display device 110 and a breakdown of the touch sensor metal on the touch buffer layer 251.

In a touch sensor structure based on a mutual capacitance, the touch electrodes 255 and 256 may be disposed on the touch buffer layer 251 and may alternate each other.

The touch connecting lines 252 and 254 may electrically connect the touch electrodes 255 and 256. The touch connecting lines 252 and 254 and the touch electrodes 255 and 256 may be disposed in different layers, and a touch insulating layer 253 may be disposed between the touch connecting lines 252 and 254 and the touch electrodes 255 and 256.

The touch connecting lines 252 and 254 may be disposed to overlap the bank layer BNK to prevent reduction of an aperture ratio.

The touch electrodes 255 and 256 may be electrically connected to a touch driving circuit (not shown) through a portion of the touch connecting line 252 passing through a top surface and a side surface of the encapsulating layer 220 and a top surface and a side surface of the dam DAM and connected to a touch pad PAD.

The portion of the touch connecting line 252 may receive a touch driving signal from the touch driving circuit and may transmit the touch driving signal to the touch electrodes 255 and 256. The portion of the touch connecting line 252 may transmit a touch sensing signal of the touch electrodes 255 and 256 to the touch driving circuit.

A touch protecting layer 257 may be disposed on the touch electrodes 255 and 256. Although the touch protecting layer 257 is disposed on the touch electrodes 255 and 256 in an embodiment of FIG. 2, the touch protecting layer 257 may extend a front or a rear of the dam DAM to be disposed on the touch connecting line 252.

A color filter (not shown) may be disposed on the encapsulating layer 220. The color filter may be disposed on the touch layer or may be disposed between the encapsulating layer 220 and the touch layer.

A structure and an operation of the first and second gate driving units 130 and 135 and the first, second, third and fourth subpixels SP1, SP2, SP3 and SP4 of the display device 110 will be illustrated with reference to a drawing.

Figure 3:
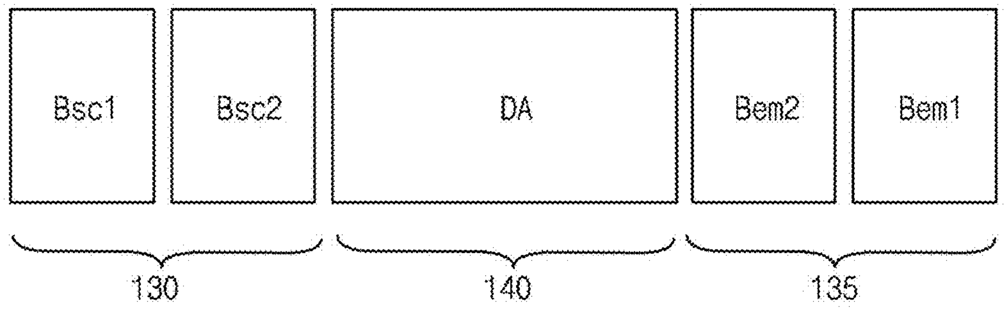
FIG. 3 is a block diagram showing first and second gate driving units and a display panel of a display device according to a first embodiment of the present disclosure.
Figure 4:
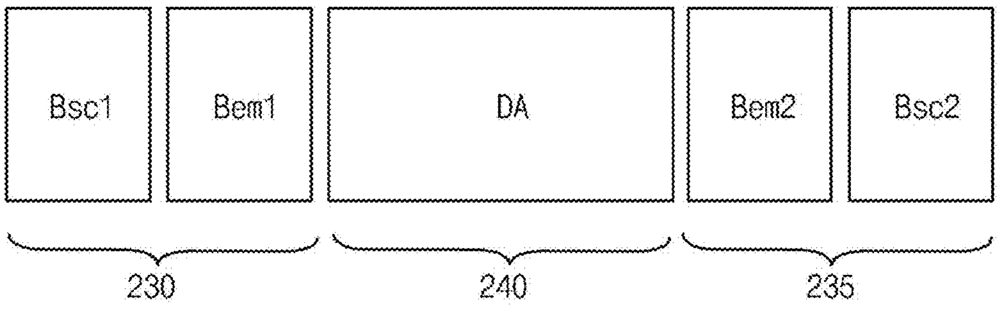
FIG. 4 is a block diagram showing first and second gate driving units and a display panel of a display device according to a second embodiment of the present disclosure.
Figure 5:
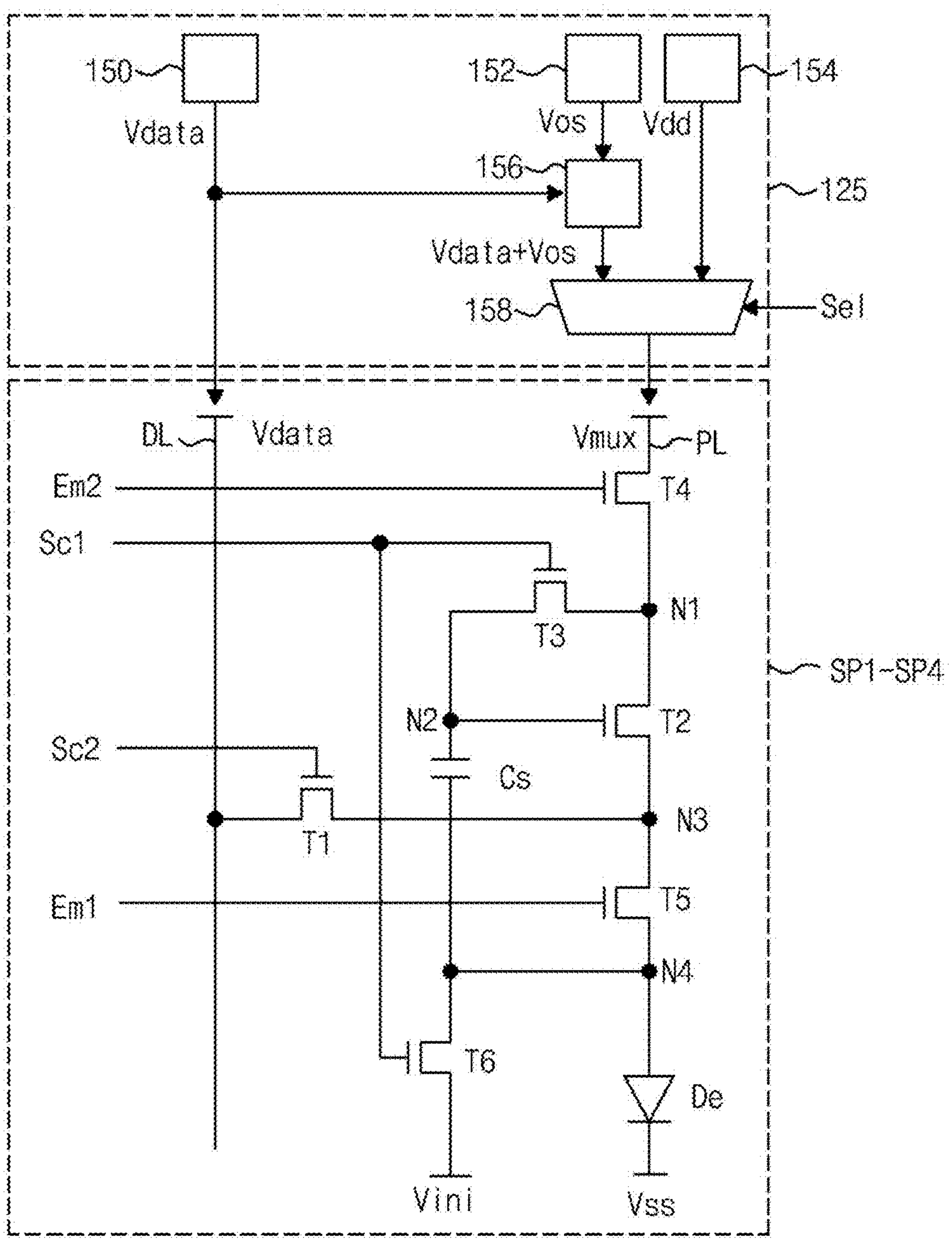
FIG. 5 is a circuit diagram showing a subpixel of a display device according to a first embodiment of the present disclosure.

FIG. 3 is a block diagram showing first and second gate driving units and a display panel of a display device according to a first embodiment of the present disclosure, FIG. 4 is a block diagram showing first and second gate driving units and a display panel of a display device according to a second embodiment of the present disclosure, and FIG. 5 is a circuit diagram showing a subpixel of a display device according to a first embodiment of the present disclosure.

In FIG. 3, the first gate driving unit 130 of the display device 110 according to a first embodiment of the present disclosure includes a gate1 signal block Bsc1 and a gate2 signal block Bsc2, and the second gate driving unit 135 of the display device 110 according to a first embodiment of the present disclosure includes an emission1 signal block Bem1 and an emission2 signal block Bem2. The display area DA of the display panel 140 is disposed between the first and second gate driving units 130 and 135.

In a first embodiment of FIG. 3, the gate1 signal block Bsc1 is disposed farther from a first side of the display panel 140 than the gate2 signal block Bsc2 and the emission1 signal block Bem1 is disposed farther from a second side of the display panel 140 than the emission2 signal block Bem2. In another embodiment, the gate2 signal block Bsc2 may be disposed farther from the first side of the display panel 140 than the gate1 signal block Bsc1 and the emission2 signal block Bem2 may be disposed farther from the second side of the display panel 140 than the emission1 signal block Bem1.

Each of the gate1 signal block Bsc1 and the gate2 signal block Bsc2 of the first gate driving unit 130 and the emission1 signal block Bem1 and the emission2 signal block Bem2 of the second gate driving unit 135 may be one stage of a shift register, and the shift register may include a plurality of stages connected to each other in a cascade type.

In the first gate driving unit 130, the gate1 signal block Bsc1 generates a gate1 signal Sc1 (of FIG. 5), and the gate2 signal block Bsc2 generates a gate2 signal Sc2 (of FIG. 5).

In the second gate driving unit 135, the emission1 signal block Bem1 generates an emission1 signal Em1 (of FIG. 5), and the emission2 signal block Bem2 generates an emission2 signal Em2 (of FIG. 5).

The gate1 signal Sc1 of the gate1 signal block Bsc1 is supplied to third and sixth transistors T3 and T6 (of FIG. 5) in each of subpixels SP1 to SP4 of the display area DA through the gate line GL (e.g., a first gate line). The gate2 signal Sc2 of the gate2 signal block Bsc2 is supplied to a first transistor T1 (of FIG. 5) in each of subpixels SP1 to SP4 of the display area DA through the gate line GL (e.g., a second gate line).

The emission1 signal Em1 of the emission1 signal block Bem1 is supplied to a fifth transistor T5 (of FIG. 5) in each of subpixels SP1 to SP4 of the display area DA through the gate line GL (e.g., a third gate line). The emisson2 signal Em2 of the emission2 signal block Bem2 is supplied to a fourth transistor T4 (of FIG. 5) in each of subpixels SP1 to SP4 of the display area DA through the gate line GL (e.g., a fourth gate line).

In another embodiment, the structure of the gate1 signal block Bsc1, the gate2 signal block Bsc2, the emission1 signal block Bem1 and the emission2 signal block Bem2 may be variously changed in the first and second gate driving units 130 and 135.

In FIG. 4, a first gate driving unit 230 of a display device according to a second embodiment of the present disclosure includes a gate1 signal block Bsc1 and an emission1 signal block Bem1, and a second gate driving unit 235 of the display device according to a second embodiment of the present disclosure includes a gate2 signal block Bsc2 and an emission2 signal block Bem2. A display area DA of a display panel 240 is disposed between the first and second gate driving units 230 and 235.

In a second embodiment of FIG. 4, the gate1 signal block Bsc1 is disposed farther from the first side of the display panel 240 than the emission1 signal block Bem1 and the gate2 signal block Bsc2 is disposed farther from the second side of the display panel 240 than the emission2 signal block Bem2. In another embodiment, the emission1 signal block Bem1 may be disposed farther from the first side of the display panel 240 than the gate1 signal block Bsc1 and the emission2 signal block Bem2 may be disposed farther from the second side of the display panel 240 than the gate2 signal block Bsc2.

In another embodiment, the first and second gate driving units 130 and 135 may have a symmetrical structure. For example, each of the first and second gate driving units 130 and 135 may include the gate1 signal block Bsc1, the gate2 signal block Bsc2, the emission1 signal block Bem1 and the emission2 signal block Bem2.

In FIG. 5, the data driving unit 125 of the display device 110 according to a first embodiment of the present disclosure includes a gamma part 150 (e.g., a gamma circuit), an offset part 152 (e.g., an offset circuit), a high level part 154 (e.g., a high level circuit), an addition part 156 (e.g., an addition circuit) and a mux part 158 (e.g., a multiplexor).

The gamma part 150 outputs the data signal Vdata corresponding to the image data and supplies the data signal Vdata to the addition part 156 and the data line DL of each subpixel SP1 to SP4 of the display panel 140.

The offset part 152 outputs an offset signal Vos that is smaller than (e.g., less than) the data signal Vdata to the addition part 156. The offset signal Vos may be greater than 0% of a gate high voltage VGH which is a maximum of the data signal Vdata and smaller than about 100% of the gate high voltage VGH. For example, the gate high voltage may be about 16.5V, and the offset signal Vos may be voltages obtained by dividing a voltage between about 0V to about 16.5V with about 0.1V.

The high level part 154 outputs the high level voltage signal Vdd and supplies the high level voltage signal Vdd to the mux part 158.

The addition part 156 supplies a sum (Vdata+Vos) of the data signal Vdata and the offset signal Vos to the mux part 158.

The mux part 158 selects one of the high level voltage signal Vdd and the sum (Vdata+Vos) of the data signal Vdata and the offset signal Vos according to a selection signal Sel and supplies the selected one to the power line PL of each subpixel SP1 to SP4 of the display panel 140 as a mux signal Vmux.

For example, when the selection signal Sel is a logic low voltage, the mux part 158 may select the high level voltage signal Vdd of the high level part 154. When the selection signal Sel is a logic high voltage, the mux part 158 may select the sum (Vdata+Vos) of the data signal Vdata and the offset signal Vos of the addition part 156. The mux part 158 may be a multiplexer.

Each of the first to fourth subpixels SP1 to SP4 of the display panel 140 includes first to sixth transistors T1 to T6, a storage capacitor Cs and a light emitting diode De. At least one of the first to sixth transistors T1 to T6 may be an oxide semiconductor thin film transistor, and the others of the first to sixth transistors T1 to T6 may be a low temperature polycrystalline silicon thin film transistor.

For example, the second, third, fourth and fifth transistors T2, T3, T4 and T5 may be a negative (N) type low temperature polycrystalline silicon thin film transistor, and the first and sixth transistors T1 and T6 may be a negative (N) type oxide semiconductor thin film transistor.

The first transistor T1 is a switching transistor and is switched on or off according to a gate2 signal Sc2. A gate electrode of the first transistor T1 is connected to the gate2 signal Sc2, a source electrode of the first transistor T1 is connected to a source electrode of the second transistor T2 and a drain electrode of the fifth transistor T5, and a drain electrode of the first transistor T1 is connected to the data signal Vdata.

The second transistor T2 is a driving transistor and is switched on or off according to a voltage of a first capacitor electrode of the storage capacitor Cs. The driving transistor is configured to control a driving current that is supplied to the light emitting diode De. A gate electrode of the second transistor T2 is connected to the first capacitor electrode of the storage capacitor Cs and a drain electrode of the third transistor T3 at node N2, a source electrode of the second transistor T2 is connected to a source electrode of the first transistor T1 and a drain electrode of the fifth transistor T5 at node N3, and a drain electrode of the second transistor T2 is connected to a source electrode of the third transistor T3 and a source electrode of the fourth transistor T4 at node N1.

The third transistor T3 is a sensing transistor and is switched on or off according to a gate1 signal Sc1. A gate electrode of the third transistor T3 is connected to the gate1 signal Sc1, a source electrode of the third transistor T3 is connected to a drain electrode of the second transistor T2 at node N1, and a drain electrode of the third transistor T3 is connected to a gate electrode of the second transistor T2 and a first capacitor electrode of the storage capacitor Cs at node N2.

The fourth transistor T4 is an emitting transistor and is switched on or off according to an emission2 signal Em2. A gate electrode of the fourth transistor T4 is connected to the emission2 signal Em2, a source electrode of the fourth transistor T4 is connected to a drain electrode of the second transistor T2 and a source electrode of the third transistor T3 at node N1, and a drain electrode of the fourth transistor T4 is connected to the mux signal Vmux.

The fifth transistor T5 is an emission transistor and is switched according to an emission1 signal Em1. A gate electrode of the fifth transistor T5 is connected to the emission1 signal Em1, a source electrode of the fifth transistor T5 is connected to an anode of the light emitting diode De, a drain electrode of the sixth transistor T6 and a second capacitor electrode of the storage capacitor Cs at node N4, and a drain electrode of the fifth transistor T5 is connected to a source electrode of the first transistor T1 and a source electrode of the second transistor T2 at node N3.

The sixth transistor T6 is an initialization transistor and is switched on or off according to the gate1 signal Sc1. A gate electrode of the sixth transistor T6 is connected to the gate1 signal Sc1, a drain electrode of the sixth transistor T6 is connected to a source electrode of the fifth transistor T5, an anode of the light emitting diode De and a second capacitor electrode of the storage capacitor Cs at node N4, and a source electrode of the sixth transistor T6 is connected to an initialization line that supplies an initial voltage Vini.

The storage capacitor Cs stores the data signal Vdata and the threshold voltage Vth. A first capacitor electrode of the storage capacitor Cs is connected to the gate electrode of the second transistor T2 and the drain electrode of the third transistor T3 at node N2, and a second capacitor electrode of the storage capacitor Cs is connected to the source electrode of the fifth transistor T5, the source electrode of the sixth transistor T6 and the anode of the light emitting diode De at node N4.

The light emitting diode De is connected between the fifth and sixth transistors T5 and T6 and the low level voltage signal Vss to emit a light of a luminance proportional to a current of the second transistor T2. An anode of the light emitting diode De is connected to the source electrode of the fifth transistor T5, the source electrode of the sixth transistor T6 and the second capacitor electrode of the storage capacitor Cs at node N4, and a cathode of the light emitting diode De is connected to the low level voltage line that supplies the low level voltage signal Vss.

The drain electrode of the second transistor T2, the source electrode of the third transistor T3 and the source electrode of the fourth transistor T4 constitute a first node N1, and the gate electrode of the second transistor T2, the drain electrode of the third transistor T3 and the first capacitor electrode of the storage capacitor Cs constitute a second node N2. The source electrode of the first transistor T1, the source electrode of the second transistor T2 and the drain electrode of the fifth transistor T5 constitute a third node N3, and the source electrode of the fifth transistor T5, the source electrode of the sixth transistor T6, the second capacitor electrode of the storage capacitor Cs and the anode of the light emitting diode De constitute a fourth node N4.

The data signal Vdata and the mux signal Vmux are supplied to each of the first to fourth subpixels SP1 to SP4 of the display panel 140 from the data driving unit 125, and the gate1 signal Sc1, the gate2 signal Sc2, the emission1 signal Em1 and the emission2 signal Em2 are supplied to each of the first to fourth subpixels SP1 to SP4 of the display panel 140 from the first and second gate driving units 130 and 135.

The display device 110 may be driven by classifying one frame into an initialization period, a sampling period and an emission period.

Figure 6:
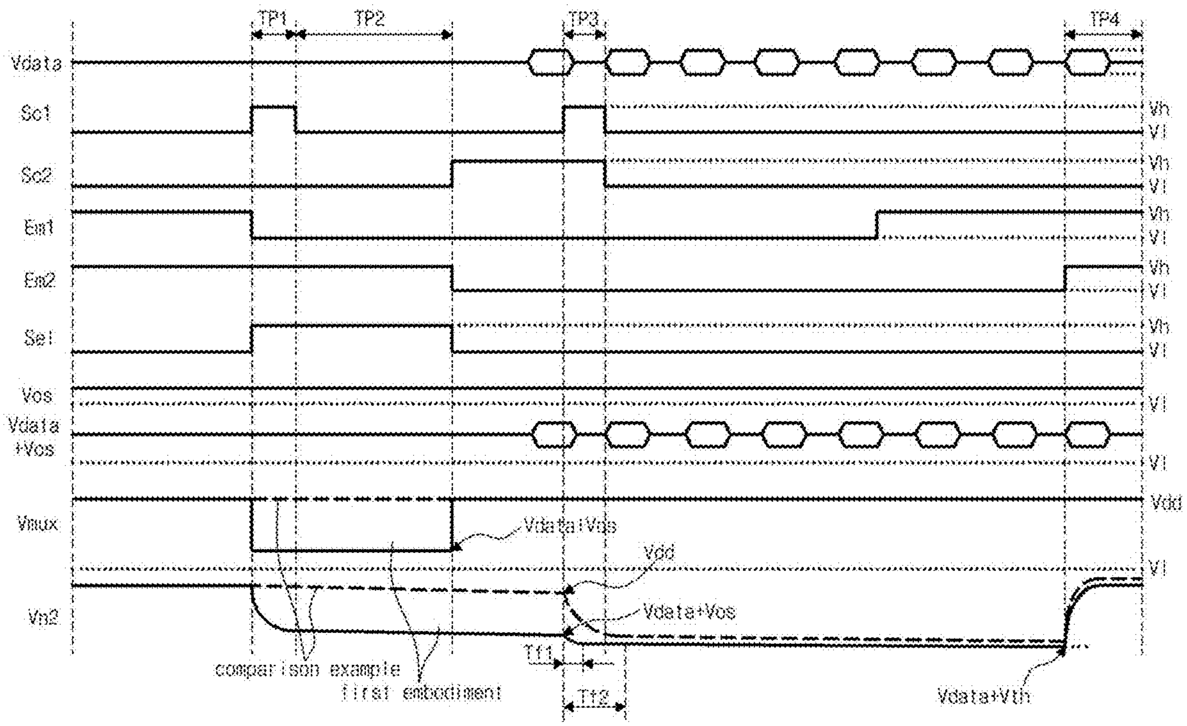
FIG. 6 is a view showing a plurality of signals of a display device according to a first embodiment of the present disclosure.

FIG. 6 is a view showing a plurality of signals of a display device according to a first embodiment of the present disclosure, and FIGS. 7A to 7D are views showing operation states of a data driving unit and a subpixel in first to fourth periods, respectively, of a display device according to a first embodiment of the present disclosure.

Figure 7A:
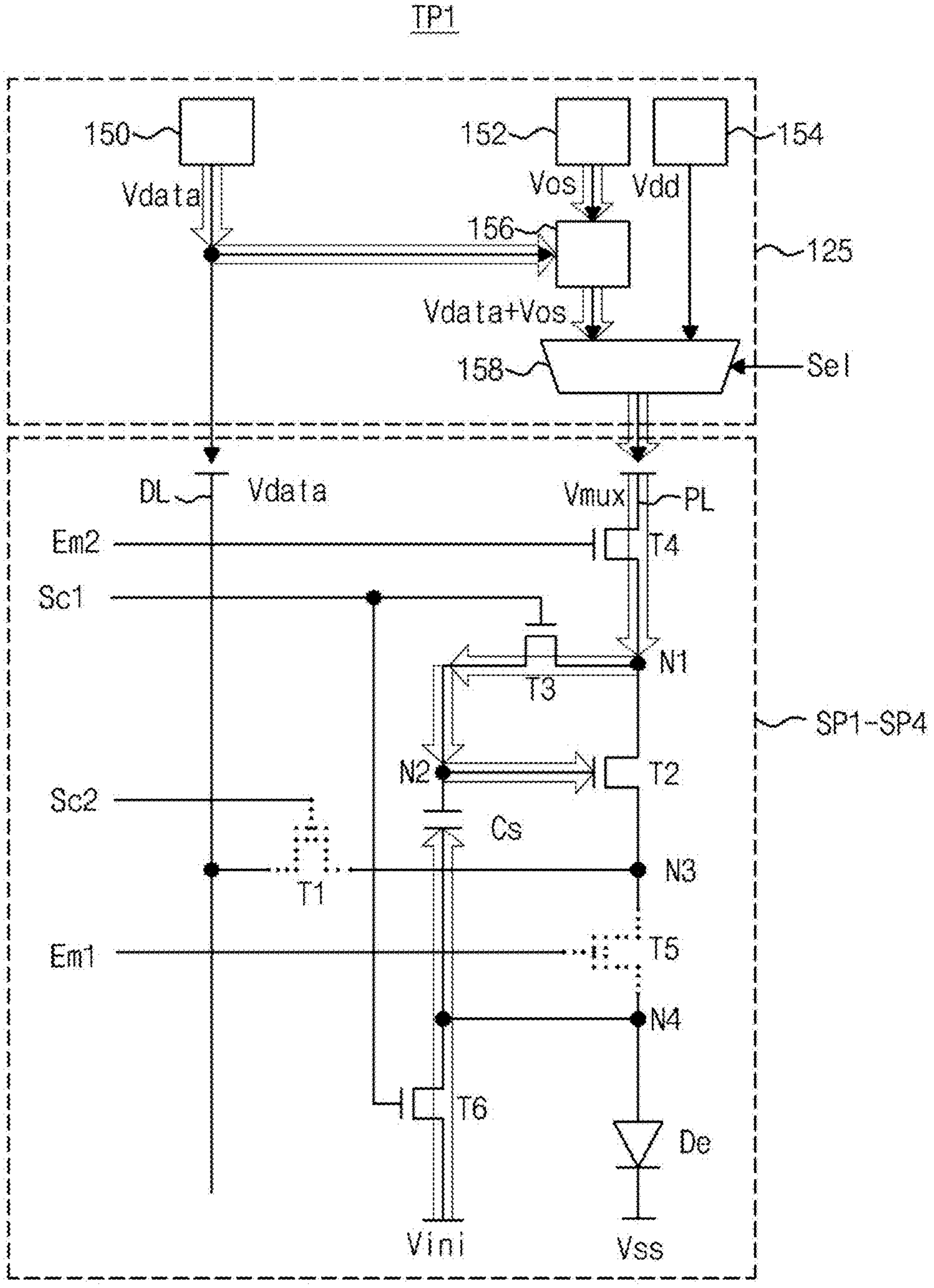
FIGS. 7A to 7D are views showing operation states of a data driving unit and a subpixel in first to fourth periods, respectively, of a display device according to a first embodiment of the present disclosure.

In FIGS. 6 and 7A, during a first period TP1 of a first initialization period of the display device 110 according to a first embodiment of the present disclosure, the gate1 signal Sc1, the emission2 signal Em2 and the selection signal Sel have a logic high voltage Vh, and the gate2 signal Sc2 and the emission1 signal Em1 have a logic low voltage Vl.

As a result, the mux part 158 selects the sum (Vdata+Vos) of the data signal Vdata and the offset signal Vos and outputs the sum (Vdata+Vos) as the mux signal Vmux. The first and fifth transistors T1 and T5 are turned off, and the third, fourth and sixth transistors T3, T4 and T6 are turned on. Accordingly, the mux signal Vmux of the sum (Vdata+Vos) of the data signal Vdata and the offset signal Vos is applied to the first and second nodes N1 and N2 through the fourth and third transistors T4 and T3, and the initial voltage Vini is applied to the fourth node N4 through the sixth transistor T6.

During the first period TP1, since the sum (Vdata+Vos) of the data signal Vdata and the offset signal Vos is applied to the second node N2, a voltage Vn2 of the second node N2 of the first capacitor electrode of the storage capacitor Cs and the gate electrode of the second transistor T2 is initialized to the sum (Vdata+Vos) of the data signal Vdata and the offset signal Vos. Further, since the initial voltage Vini is applied to the fourth node N4, a voltage of the fourth node N4 of the second capacitor electrode of the storage capacitor Cs and the anode of the light emitting diode De is initialized to the initial voltage Vini.

In a display device according to a comparison example where the data driving unit 125 always supplies the high level voltage signal Vdd to the power line PL, during the first period TP1 of a first initialization period, a voltage Vn2 of the second node N2 of the first capacitor electrode of the storage capacitor Cs and the gate electrode of the second transistor T2 is initialized to the high level voltage signal Vdd.

Figure 7B:
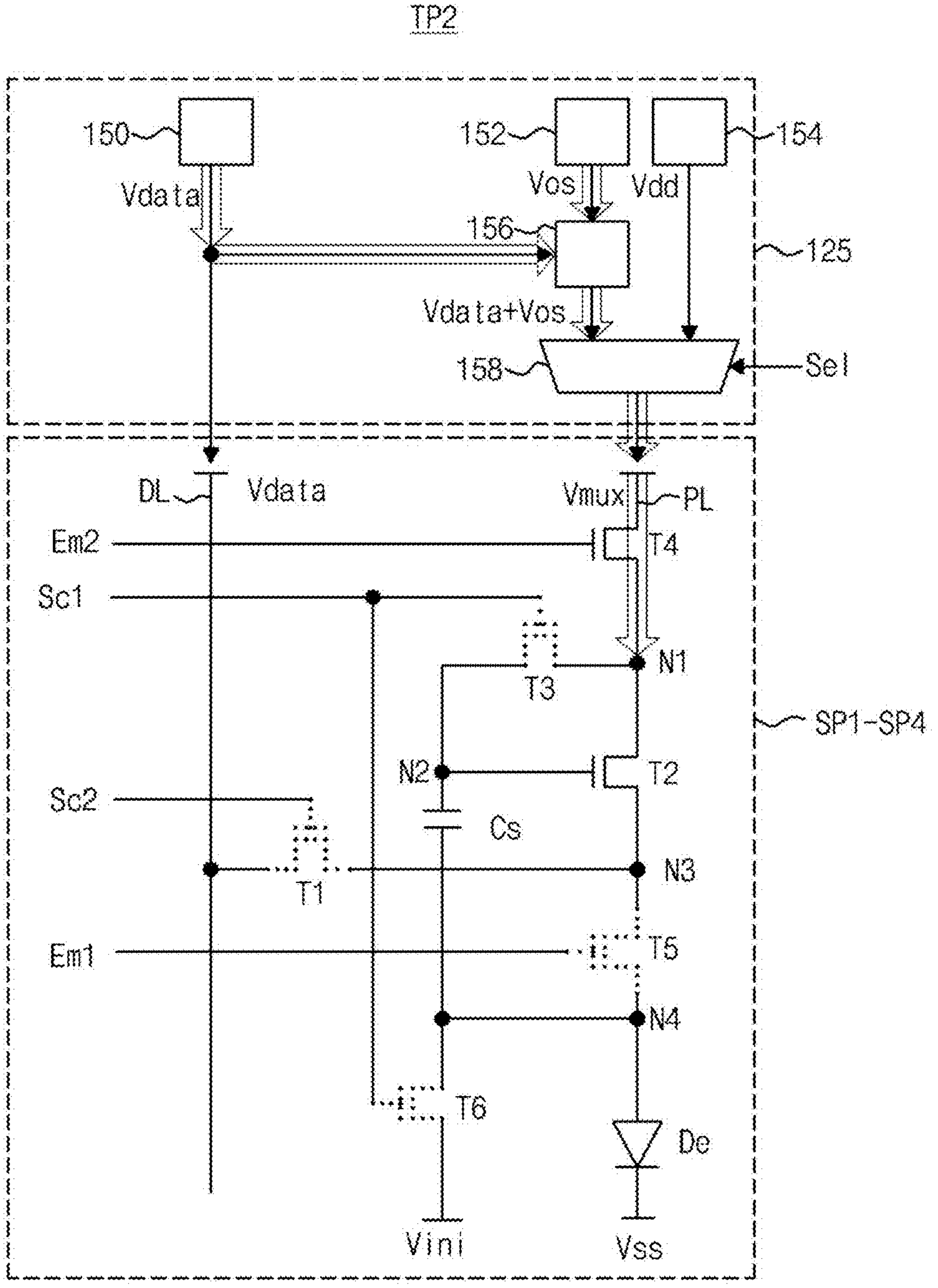

In FIGS. 6 and 7B, during a second period TP2 of a second initialization period of the display device 110 according to a first embodiment of the present disclosure, the gate1 signal Sc1, the gate2 signal Sc2 and the emission1 signal Em1 have a logic low voltage Vl, and the emission2 signal Em2 and the selection signal Sel have a logic high voltage Vh.

As a result, the mux part 158 selects the sum (Vdata+Vos) of the data signal Vdata and the offset signal Vos and outputs the sum (Vdata+Vos) as the mux signal Vmux. The first, third, fifth and sixth transistors T1, T3, T5 and T6 are turned off, and the fourth transistor T4 is turned on. Accordingly, the mux signal Vmux of the sum (Vdata+Vos) of the data signal Vdata and the offset signal Vos is applied to the first node N1 through the fourth transistor T4.

During the second period TP2, the sum (Vdata+Vos) of the data signal Vdata and the offset signal Vos applied to the second node N2 is maintained, and the initial voltage Vini applied to the fourth node N4 is maintained. Here, the voltage Vn2 of the second node N2 may be reduced due to a leakage, etc.

In a display device according to a comparison example where the data driving unit 125 always supplies the high level voltage signal Vdd to the power line PL, during the second period TP2 of a second initialization period, the high level voltage signal Vdd applied to the second node N2 is maintained. Here, the voltage Vn2 of the second node N2 may be reduced due to a leakage, etc.

Figure 7C:
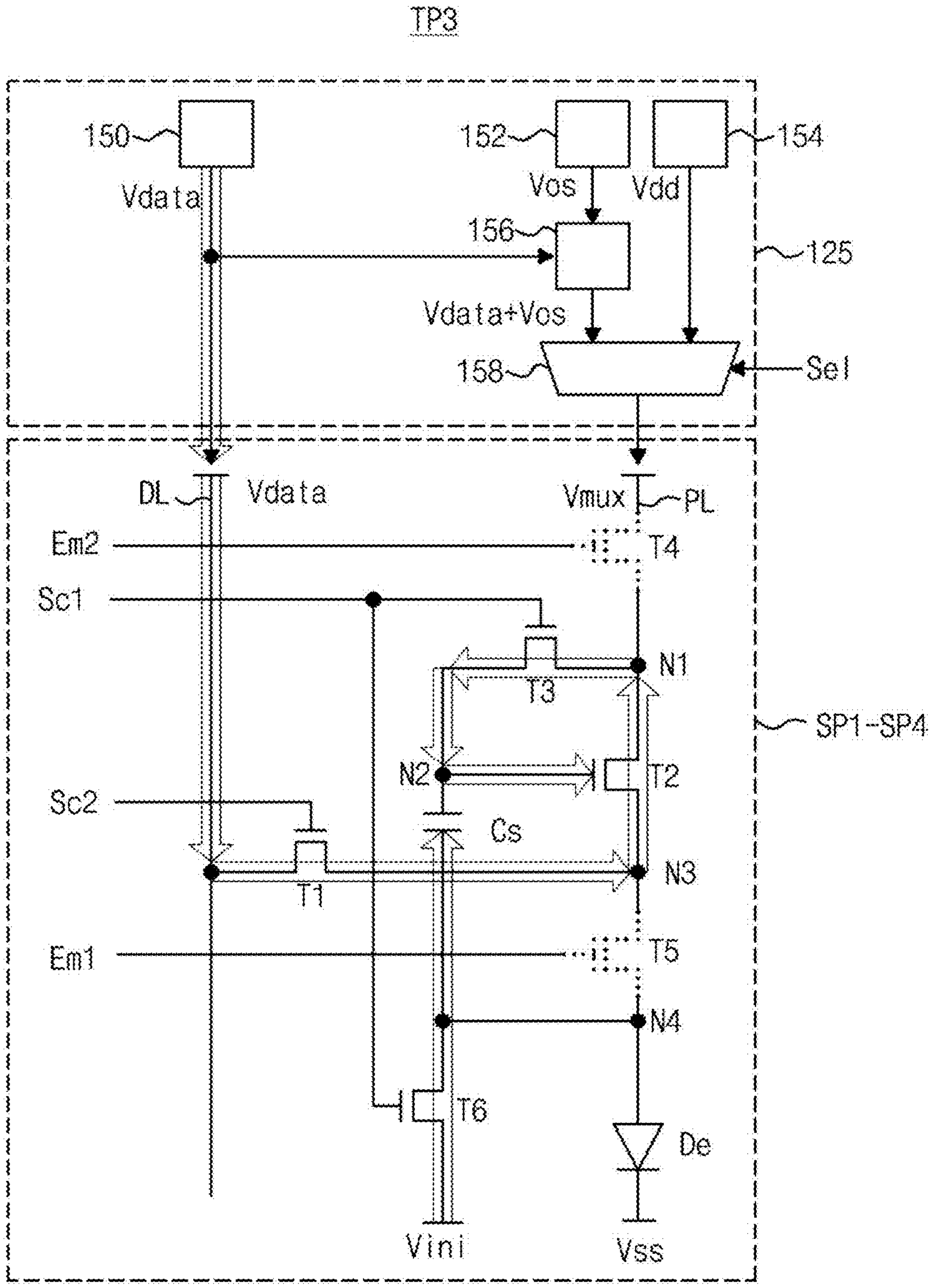

In FIGS. 6 and 7C, during a third period TP3 of a sampling period of the display device 110 according to a first embodiment of the present disclosure, the gate1 signal Sc1 and the gate2 signal Sc2 have a logic high voltage Vh, and the emission1 signal Em1, the emission2 signal Em2 and the selection signal Sel have a logic low voltage Vl.

As a result, the mux part 158 outputs the high level voltage signal Vdd as the mux signal Vmux. The first, third and sixth transistors T1, T3 and T6 are turned on, and the fourth and fifth transistors T4 and T5 are turned off. Accordingly, the data signal Vdata is applied to the third, first and second nodes N3, N1 and N2 through the first, second and third transistors T1, T2 and T3, and the initial voltage Vini is applied to the fourth node N4 through the sixth transistor T6.

During the third period TP3, since a sum (Vdata+Vth) of the data signal Vdata and the threshold voltage Vth of the second transistor T2 is applied to the second node N2, compensation for the threshold voltage Vth of the second transistor T2 is performed. Since the initial voltage Vini is applied to the fourth node N4, a voltage of the second capacitor electrode of the storage capacitor Cs and the anode of the light emitting diode De is maintained as the initial voltage Vini.

Here, the voltage Vn2 of the second node N2 may be reduced from the sum (Vdata+Vos) of the data signal Vdata and the offset signal Vos to the sum (Vdata+Vth) of the data signal Vdata and the threshold voltage Vth. Since the sum (Vdata+Vos) of the data signal Vdata and the offset signal Vos and the sum (Vdata+Vth) of the data signal Vdata and the threshold voltage Vth have a relatively small voltage difference (Vos-Vth), a hysteresis of the second transistor T2 of a driving transistor is reduced or minimized.

Accordingly, in the display device 110 according to a first embodiment of the present disclosure, the voltage Vn2 of the second node N2 has a first falling time Tf1 having a width smaller than a width (e.g., a duration) of the third period TP3, and the voltage Vn2 of the second node N2 may reach the sum (Vdata+Vth) of the data signal Vdata and the threshold voltage Vth of a target voltage within the third period TP3.

In a display device according to a comparison example where the data driving unit 125 always supplies the high level voltage signal Vdd to the power line PL, during the third period TP3 of a sampling period, the sum (Vdata+Vth) of the data signal Vdata and the threshold voltage Vth of the second transistor T2 is applied to the second node N2, and compensation for the threshold voltage Vth of the second transistor T2 is performed. Further, the initial voltage Vini is applied to the fourth node N4, and the voltage of the second capacitor electrode of the storage capacitor Cs and the anode of the light emitting diode De is maintained as the initial voltage Vini.

Here, the voltage Vn2 of the second node N2 may be reduced from the high level voltage signal Vdd to the sum (Vdata+Vth) of the data signal Vdata and the threshold voltage Vth. Since the high level voltage signal Vdd and the sum (Vdata+Vth) of the data signal Vdata and the threshold voltage Vth have a relatively great voltage difference (Vdd-Vdata-Vth), a hysteresis of the second transistor T2 of a driving transistor occurs.

Accordingly, in the display device 110 according to a comparison example where the data driving unit 125 always supplies the high level voltage signal Vdd to the power line PL, the voltage Vn2 of the second node N2 has a second falling time Tf2 having a width greater than a width of the third period TP3, and the voltage Vn2 of the second node N2 may not reach the sum (Vdata+Vth) of the data signal Vdata and the threshold voltage Vth of a target voltage within the third period TP3.

Figure 7D:
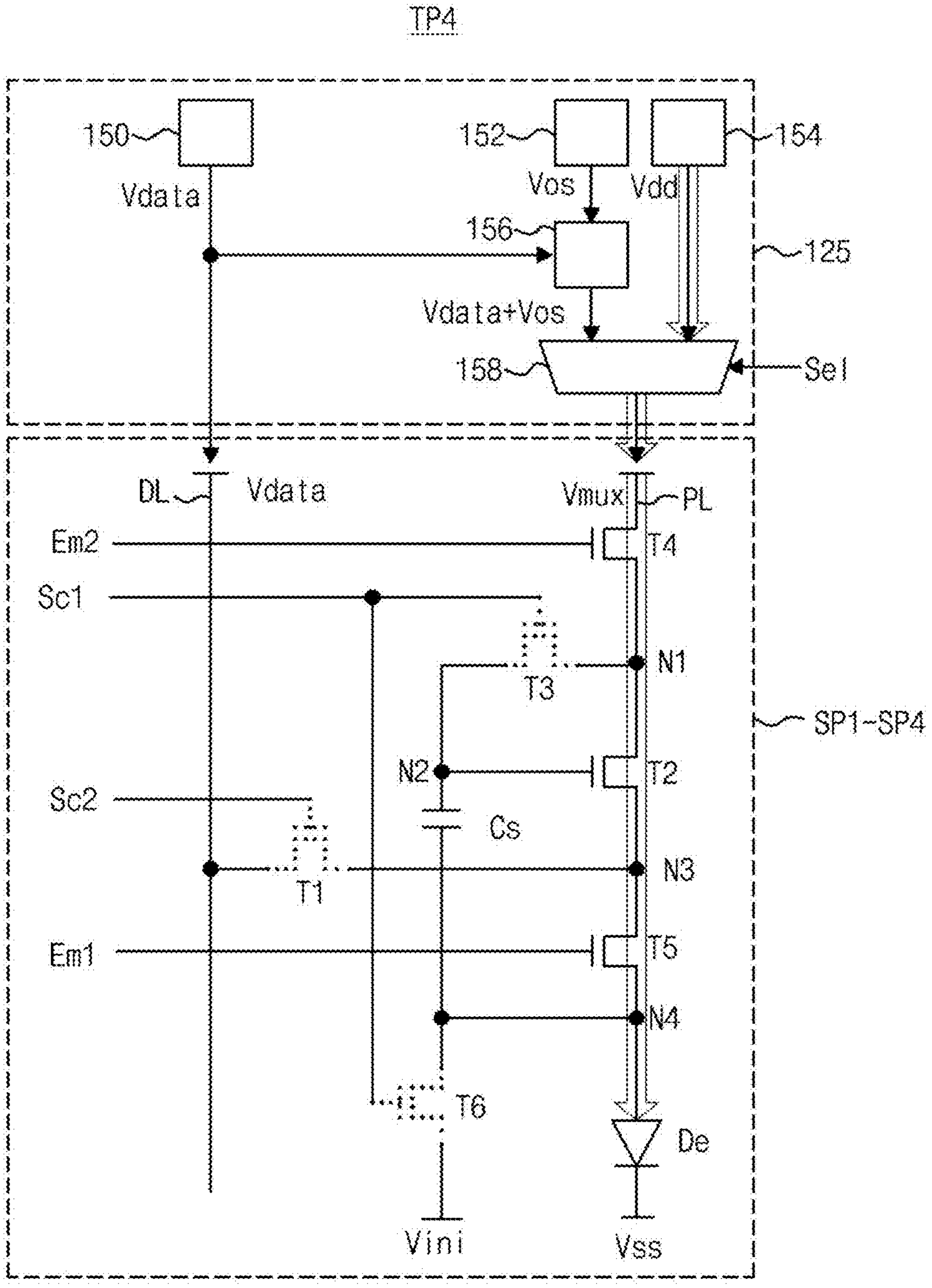

In FIGS. 6 and 7D, during a fourth period TP4 of an emission period of the display device 110 according to a first embodiment of the present disclosure, the gate1 signal Sc1, the gate2 signal Sc2 and the selection signal Sel have a logic low voltage Vl, and the emission1 signal Em1 and the emission2 signal Em2 have a logic high voltage Vh.

As a result, the mux part 158 outputs the high level voltage signal Vdd as the mux signal Vmux. The first, third and sixth transistors T1, T3 and T6 are turned off, and the fourth and fifth transistors T4 and T5 are turned on. Accordingly, the high level voltage signal Vdd is applied to the first, third and fourth nodes N1, N3 and N4 through the fourth, second and fifth transistors T4, T2 and T5. Here, the threshold voltage Vth is compensated, and a current corresponding to the data signal Vdata flows in the second transistor T2 turned on.

During the fourth period TP4, since the high level voltage signal Vdd is applied to the first, third and fourth nodes N1, N3 and N4, the light emitting diode De emits a light corresponding to the voltage Vn2 of the second node N2.

Here, since a hysteresis of the second transistor T2 of a driving transistor is minimized and the voltage Vn2 of the second node N2 becomes the sum (Vdata+Vth) of the data signal Vdata and the threshold voltage Vth of a target voltage, the light emitting diode De emits a light having a target luminance corresponding to the inputted data signal Vdata.

In a display device according to a comparison example where the data driving unit 125 always supplies the high level voltage signal Vdd to the power line PL, during the fourth period TP4 of an emission period, the high level voltage signal Vdd is applied to the first, third and fourth nodes N1, N3 and N4, and the light emitting diode De emits a light corresponding to a voltage Vn2 of the second node N2.

Here, since a hysteresis of the second transistor T2 of a driving transistor occurs and the voltage Vn2 of the second node N2 is different from the sum (Vdata+Vth) of the data signal Vdata and the threshold voltage Vth of a target voltage, the light emitting diode De emits a light having a luminance different from a target luminance corresponding to the inputted data signal Vdata.

Consequently, in the display device according to the present disclosure, during the first and second periods TP1 and TP2 of the first and second initialization periods, since the sum (Vdata+Vos) of the data signal Vdata and the offset signal Vos having a relatively small voltage difference with the data signal Vdata instead of the high level voltage signal Vdd having a relatively great voltage difference with the data signal Vdata is supplied to the gate electrode of the second transistor T2 of a driving transistor, a hysteresis of the second transistor T2 of a driving transistor is reduced or minimized and the response speed is improved.

Further, since the gate electrode of the second transistor T2 of a driving transistor reaches a target voltage within a relatively short time period due to minimization of the hysteresis, the light emitting diode De emits a light corresponding to a target luminance and a display quality is improved.

It will be apparent to those skilled in the art that various modifications and variation can be made in the present disclosure without departing from the scope of the disclosure. Thus, it is intended that the present disclosure cover the modifications and variations of this disclosure provided they come within the scope of the appended claims.

What is claimed is:

1. A display device comprising: a display panel including a data line, a power line, and a pixel circuit, the pixel circuit comprising: a driving transistor that is electrically connected to the power line, the driving transistor configured to control a driving current; a switching transistor connected to the data line and the driving transistor, the switching transistor configured to supply a data voltage supplied by the data line to the driving transistor; and a light emitting element that is electrically connected to the driving transistor, the light emitting element configured to emit light according to the driving current; and a circuit configured to output a mux signal having a first voltage to the driving transistor via the power line at a second time and output the mux signal having a second voltage that is less than the first voltage at a first time that is before the second time, the second voltage of the mux signal at the second time based on the data voltage, wherein the second voltage of the mux signal is a sum of the data voltage and an offset voltage.

2. The display device of claim 1, wherein the offset voltage is greater than 0% of a maximum value of the data voltage and is less than 100% of the maximum value of the data voltage.

3. The display device of claim 2, wherein the circuit comprises:

- a gamma circuit configured to output the data voltage;
- an offset circuit configured to output the offset voltage;
- a first voltage circuit configured to output the first voltage;
- a second voltage circuit that is connected to the gamma circuit and the offset circuit, the second voltage circuit configured to receive the data voltage from the gamma circuit and the offset voltage from the offset circuit, and output the second voltage that is the sum of the data voltage and the offset voltage; and
- a mux circuit connected to the first voltage circuit and the second voltage circuit, the mux circuit configured to select one among the first voltage and the second voltage that is the sum of the data voltage and the offset voltage according to a selection signal, and supply the selected one as the mux signal to the power line of the display panel.

4. The display device of claim 3, wherein the gamma circuit is further configured to supply the data voltage to the data line of the display panel.

5. The display device of claim 1, wherein the driving transistor includes a drain electrode of the driving transistor at a first node, a gate electrode of the driving transistor at a second node, and a source electrode of the driving transistor at a third node, and the switching transistor includes a drain electrode of the switching transistor that is connected to the data line, a gate electrode of the switching transistor that is connected to a second gate line that supplies a second scan signal, and a source electrode of the switching transistor that is connected to the source electrode of the driving transistor at the third node, the pixel circuit further comprising:

- a sensing transistor including a drain electrode that is connected to the drain electrode of the driving transistor at the first node, a gate electrode of the sensing transistor that is connected to a first gate line that supplies a first scan signal, and a source electrode of the sensing transistor that is connected to the gate electrode of the driving transistor at the second node;
- a first emission transistor including a first electrode connected to the source electrode of the driving transistor and the source electrode of the switching transistor at the third node, a gate electrode of the first emission transistor connected to a third gate line that supplies a first emission signal, and a source electrode connected to an anode electrode of the light emitting element at a fourth node;
- a second emission transistor including a drain electrode connected to the power line that supplies the mux signal, a gate electrode of the second emission transistor that is connected to a fourth gate line that supplies a second emission signal, and a source electrode of the second emission transistor that is connected to the drain electrode of the sensing transistor and the drain electrode of the driving transistor at the first node;
- an initialization transistor including a drain electrode of the initialization transistor that is connected to the anode electrode of the light emitting element and the source electrode of the first emission transistor at the fourth node, a gate electrode of the initialization transistor that is connected to the first gate line and the gate electrode of the sensing transistor, and a source electrode that is connected to an initialization line that supplies an initial voltage; and
- a storage capacitor including a first capacitor electrode that is connected to the source electrode of the sensing transistor and the gate electrode of the driving transistor at the second node and a second capacitor electrode that is connected to the drain electrode of the initialization transistor, the source electrode of the first emission transistor, and the anode electrode of the light emitting element at the fourth node.

6. The display device of claim 5, wherein during the first time, the mux signal of the second voltage that is the sum of the data voltage and the offset voltage is applied to the gate electrode of the driving transistor through the second emission transistor and the sensing transistor, and the initial voltage is applied to the anode electrode of the light emitting element through the initialization transistor,

- wherein during a third time that is between the first time and the second time, the mux signal of the second voltage that is the sum of the data voltage and the offset voltage is applied to the drain electrode of the driving transistor through the second emission transistor,
- wherein during a fourth time that is between the third time and the second time, the data voltage is applied to the gate electrode of the driving transistor through the switching transistor, the driving transistor, and the sensing transistor, and the initial voltage is applied to the anode electrode of the light emitting element through the initialization transistor, and
- wherein during the second time that is after the fourth time, the mux signal of the first voltage is applied to the anode electrode of the light emitting element through the second emission transistor, the driving transistor, and the first emission transistor.

7. The display device of claim 5, further comprising:

a gate driving circuit including a first gate driving circuit at a first side of the display panel and a second gate driving circuit at a second side of the display panel;

wherein the first gate driving circuit includes a first gate signal circuit configured to generate the first scan signal and a second gate signal circuit configured to generate the second scan signal, the second gate signal circuit closer to the first side of the display panel than the first gate driving circuit; and wherein the second gate driving circuit includes a first emission signal circuit configured to generate the first emission signal and a second emission signal circuit configured to generate the second emission signal, the second emission signal circuit closer to the second side of the display panel than the first emission signal circuit.

8. The display device of claim 5, further comprising:

a gate driving circuit including a first gate driving circuit at a first side of the display panel and a second gate driving circuit at a second side of the display panel, wherein the first gate driving circuit includes a first gate signal circuit configured to generate the first scan signal and a first emission signal circuit configured to generate the first emission signal, the first emission signal circuit closer to the first side of the display panel than the first gate signal circuit; and wherein the second gate driving circuit includes a second gate signal circuit configured to generate the second scan signal and a second emission signal circuit configured to generate the second emission signal, the second emission signal circuit closer to the second side of the display panel than the second gate signal circuit.

* * * * *